(12) United States Patent
Chen et al.

(10) Patent No.: US 12,512,411 B2
(45) Date of Patent: Dec. 30, 2025

(54) WAFER-LEVEL ASIC 3D INTEGRATED SUBSTRATE, PACKAGING DEVICE AND PREPARATION METHOD

(71) Applicant: SJ Semiconductor(Jiangyin) Corporation, Jiangyin (CN)

(72) Inventors: Yenheng Chen, Jiangyin (CN); Chengchung Lin, Jiangyin (CN); Jangshen Lin, Jiangyin (CN); Mingchih Chen, Jiangyin (CN)

(73) Assignee: SJ Semiconductor(Jiangyin) Corporation, Jiangyin (CN)

( * ) Notice: Subject to any disclaimer, the term of this patent is extended or adjusted under 35 U.S.C. 154(b) by 710 days.

(21) Appl. No.: 17/851,870

(22) Filed: Jun. 28, 2022

(65) Prior Publication Data

US 2022/0415803 A1    Dec. 29, 2022

(30) Foreign Application Priority Data

Jun. 28, 2021   (CN) .......................... 202110721448.2
Jun. 28, 2021   (CN) .......................... 202121443445.9

(51) Int. Cl.
*H01L 23/538*   (2006.01)
*H01L 21/48*    (2006.01)
(Continued)

(52) U.S. Cl.
CPC ...... *H01L 23/5383* (2013.01); *H01L 21/4857* (2013.01); *H01L 21/486* (2013.01);
(Continued)

(58) Field of Classification Search
CPC ............. H01L 23/5383; H01L 21/4857; H01L 21/486; H01L 23/49822; H01L 23/49838; H01L 23/49894; H01L 23/5381; H01L 23/552; H01L 23/66; H01L 25/165; H01L 24/16; H01L 2223/6616; H01L 2223/6672;
(Continued)

(56) References Cited

U.S. PATENT DOCUMENTS

2016/0118333 A1* 4/2016 Lin ..................... H01L 21/6836
                                                       257/773
2016/0329284 A1* 11/2016 We ...................... H01L 25/0655
(Continued)

*Primary Examiner* — Marlon T Fletcher
*Assistant Examiner* — Christina A Sylvia
(74) *Attorney, Agent, or Firm* — IPRTOP LLC (57) ABSTRACT

A wafer-level ASIC 3D integrated substrate, a packaging device and a preparation method are disclosed. The substrate includes a first wiring layer conductive pillars, a molding layer, a second wiring layer, a bridge IC structure and solder balls. The first wiring layer includes a first dielectric layer and a first metal wire layer. The second wiring layer includes a second dielectric layer and a second metal wire layer. The conductive pillars are disposed between the first wiring layer and the second wiring layer, two ends of each of the conductive pillars are electrically connected to the first metal wire layer and the second metal wire layer, respectively. The bridge IC structure is electrically connected to at least one conductive pillar. The molding layer molds the conductive pillars and the bridge IC structure. The solder balls are disposed on a side of the second wiring layer and electrically connected to the second metal wire layer.

4 Claims, 6 Drawing Sheets

(51) Int. Cl.
| | |
|---|---|
| *H01L 23/498* | (2006.01) |
| *H01L 23/552* | (2006.01) |
| *H01L 23/66* | (2006.01) |
| *H01L 25/16* | (2023.01) |
| *H01L 23/00* | (2006.01) |

(52) U.S. Cl.
CPC .. *H01L 23/49822* (2013.01); *H01L 23/49838* (2013.01); *H01L 23/49894* (2013.01); *H01L 23/5381* (2013.01); *H01L 23/552* (2013.01); *H01L 23/66* (2013.01); *H01L 25/165* (2013.01); *H01L 24/16* (2013.01); *H01L 2223/6616* (2013.01); *H01L 2223/6672* (2013.01); *H01L 2223/6677* (2013.01); *H01L 2224/16237* (2013.01); *H01L 2924/1433* (2013.01); *H01L 2924/1438* (2013.01); *H01L 2924/15311* (2013.01); *H01L 2924/19041* (2013.01); *H01L 2924/19042* (2013.01); *H01L 2924/3025* (2013.01); *H01L 2924/37001* (2013.01)

(58) Field of Classification Search
CPC ... H01L 2223/6677; H01L 2224/16237; H01L 2924/1433; H01L 2924/1438; H01L 2924/15311; H01L 2924/19041; H01L 2924/19042; H01L 2924/3025; H01L 2924/37001; H01L 23/5385; H01L 24/13; H01L 25/18; H01L 25/16; H01L 25/50; H01Q 1/2283

See application file for complete search history.

(56) References Cited

U.S. PATENT DOCUMENTS

| | | | |
|---|---|---|---|
| 2019/0006264 A1* | 1/2019 | Vaidya | H01L 24/06 |
| 2019/0051619 A1* | 2/2019 | Kim | H01L 23/5386 |
| 2019/0088582 A1* | 3/2019 | Ting | H01L 23/49816 |
| 2019/0103379 A1* | 4/2019 | Yu | H01L 23/49811 |
| 2019/0319000 A1* | 10/2019 | Lin | H01L 23/3185 |
| 2019/0341351 A1* | 11/2019 | May | H01L 23/5385 |

* cited by examiner

WAFER-LEVEL ASIC 3D INTEGRATED SUBSTRATE, PACKAGING DEVICE AND PREPARATION METHOD

CROSS REFERENCE TO RELATED APPLICATION

The present application claims the benefit of priority to Chinese Patent Application No. CN 202110721448.2, entitled "Wafer-Level ASIC 3D Integrated Substrate, Packaging Device and Preparation Method", filed with CNIPA on Jun. 28, 2021, and Chinese Patent Application No. CN 202121443445.9, entitled "Wafer-Level ASIC 3D Integrated Substrate and Packaging Device", filed with CNIPA on Jun. 28, 2021, the content of which is incorporated herein by reference in their entireties.

FIELD OF THE TECHNOLOGY

The present disclosure relates to the technical field of semiconductor manufacturing, in particular, to the field of back-end packaging, and to a wafer-level Application Specific Integrated Circuit (ASIC) Three-Dimensional (3D) integrated substrate, a packaging device and a preparation method.

BACKGROUND

Printed Circuit Board (PCB) is the support body of electronic components and the carrier of electrical connections, and is one of the commonly used packaging substrates.

Traditional PCB boards used in batches have mostly 1 to 12 layers, the more I/O interfaces a chip has, the more layers the PCB substrate board requires, and also the price becomes higher. Traditional substrate process has certain limits. For example, the minimum line width and line spacing of the current PCB substrate are more than 50 μm, the minimum line width and line spacing on a Ball Grid Array (BGA) Integrated Circuit (IC) carrier board are 30 μm, even the most advanced process of Fine-Pitch Ball Grid Array (FBGA) IC carrier board can only achieve the minimum line width and line spacing of 20 μm. With the increasing functional integration of front-end chips, the existing packaging substrate technology using PCB boards will not be able to meet the demand of the front-end chips, although the advanced 2.5D & fan out wafer-level packaging technology is needed, this technology has disadvantages such as its high cost and long production time compared to the traditional substrate manufacturing technology, and this advanced packaging technology is only suitable for packaging wafers after completion of the front-end process and cannot be pre-customized, which may cause chip damage during the packaging process.

A need to solve the problems that PCB substrate packaging technology's process limits, from large line widths increased integration of electronic devices, high cost in fan-out wafer-level packaging and other packaging technology, long production time, and chip damage in the process of packaging.

SUMMARY

The method for preparing the wafer-level ASIC 3D integrated substrate includes: providing a carrier; forming a separation layer on the carrier; forming a first wiring layer on the separation layer, wherein the first wiring layer comprises a first dielectric layer and a first metal wire layer, wherein a top surface of the first metal wire layer is exposed from a top surface of the first dielectric layer; forming a plurality of conductive pillars on the first wiring layer, wherein the plurality of conductive pillars is electrically connected to the first metal wire layer; electrically connecting a bridge IC structure to at least one of the plurality of conductive pillars, wherein the bridge IC structure comprises conductive legs; forming a molding layer, wherein the molding layer molds the plurality of conductive pillars and the bridge IC structure, and the plurality of conductive pillars is exposed on a surface of the molding layer; forming a second wiring layer on the molding layer, wherein the second wiring layer comprises a second dielectric layer and a second metal wire layer, wherein the second metal wire layer is exposed on a surface of the second dielectric layer, and the second metal wire layer is electrically connected to the plurality of conductive pillars; forming solder balls on the second wiring layer, wherein the solder balls are electrically connected to the second metal wire layer; and peeling the carrier from the separation layer to expose a surface of the first wiring layer away from the plurality of conductive pillars, wherein the first metal wire layer is exposed on the surface of the first wiring layer.

Optionally, a thickness of the first wiring layer and a thickness of the second wiring layer ranges from 15 μm to 40 μm, and a thickness of the molding layer ranges from 50 μm to 100 μm.

Optionally, the method further includes: forming an Organic Solderability Preservatives (OSP) antioxidant layer on the surface of the first wiring layer away from the conductive pillar before peeling off the carrier, wherein the OSP antioxidant layer covers a surface of the first metal wire layer.

Optionally, when a plurality of wafer-level ASIC 3D integrated substrates is provided, the method further includes: separating the wafer-level ASIC 3D integrated substrates from each other by dicing after forming the OSP antioxidant layer.

The present disclosure further provides a wafer-level ASIC 3D integrated substrate. The substrate includes a first wiring layer, a second wiring layer, a plurality of conductive pillars, a bridge IC structure, a molding layer, and solder balls.

The first wiring layer includes a first dielectric layer and a first metal wire layer, and the first metal wire layer is exposed on a surface of the first dielectric layer. The second wiring layer includes a second dielectric layer and a second metal wire layer, and the second metal wire layer is exposed on a surface of the second dielectric layer. The plurality of conductive pillars is disposed between the first wiring layer and the second wiring layer, wherein two ends of each of the plurality of conductive pillars are electrically connected to the first metal wire layer and the second metal wire layer, respectively. The bridge IC is electrically connected to one of the conductive pillars either by shortening that conductive pillar to make space or by using the conductive legs of the bridge IC. The molding layer molds the plurality of conductive pillars and the bridge IC. The solder balls are disposed on a side of the second wiring layer away from the plurality of conductive pillars and electrically connected to the second metal wire layer.

The present disclosure further provides a packaging device. The packaging device includes a packaging chip and the above wafer-level ASIC 3D integrated substrate. The packaging chip is disposed on a surface of the wafer-level ASIC 3D integrated substrate and is electrically connected to the wafer-level ASIC 3D integrated substrate.

Optionally, the packaging device further includes an inductor and a capacitor. The inductor and the capacitor are disposed on a surface of the wafer-level ASIC 3D integrated substrate and are electrically connected to the second wiring layer. The packaging chip includes an active device, the active device is disposed on a surface of the first wiring layer away from the molding layer and is electrically connected to the first wiring layer. The active device includes one or more of a System-on-Chip (SOC) device, a High Bandwidth Memory (HBM) device, a Small Scale Integrated (SSI) device and a Power Management Unit (PMU) device, and the active device is a single active device or a plurality of active devices.

Optionally, the packaging device further includes a passive device disposed on a surface of the second wiring layer away from the molding layer and electrically connected to the second wiring layer.

Optionally, the packaging device further includes a protective layer and an antenna, the protective layer covers the active device, and the antenna is disposed on a surface of the protective layer and electrically connected to at least one of the plurality of conductive pillars.

Optionally, the packaging device further includes a protective layer and an electromagnetic interference (EMI) shield. The protective layer covers the active device, and the EMI shield extends from a surface of the protective layer to a side of the first wiring layer and the molding layer.

As mentioned above, the wafer-level ASIC 3D integrated substrate, the packaging device and the preparation method of the present disclosure have the following beneficial effects: the minimum line width and line spacing of the wafer-level ASIC 3D integrated substrate of the present disclosure can be reduced to 1.5 μm, which is much smaller than 20 μm of that of the conventional substrate, thus enabling high-density and high-integration packaging of the device. The thickness of the substrate can be less than 0.2 mm (the thickness of the traditional FBGA 10-layer board is 1 mm), which helps to further reduce size of the packaging device. The time for fabricating the substrate is short, which can realize scale customization and help to reduce the package cost. The substrate does not need to be packaged with chips, which can reduce the risk of chip damage and help to improve the packaging yield, and the bridge IC is connected to the inside of the substrate, which can further improve the integration of the packaging device. By using the wafer-level ASIC 3D integrated substrate of the present disclosure for packaging, various electronic chips and components such as millimeter wave antenna, capacitor, inductor, electric crystal switch, GPU, PMU, DDR, flash memory and filter can be integrated to realize system-level packaging. The packaging device packaged based on the wafer-level ASIC 3D integrated substrate of the present disclosure can not only reduce the cost, but also eliminate the parasitic capacitance of the substrate and reduce the device noise; meanwhile, it can improve the power efficiency and increase the device response efficiency and reliability; the requirement for the design margin of the device is low, which makes the packaging device of the present disclosure more widely applicable.

DESCRIPTION OF THE REFERENCE NUMERALS

11 Carrier
12 Separation layer
13 First wiring layer
131 First dielectric layer
132 First metal wire layer
14 Conductive pillar
15 Molding layer
16 Second wiring layer
161 Second dielectric layer
162 Second metal wire layer
17 Solder ball
18 OSP antioxidant layer
191 Active device
192 Passive device
20 Bump
21 Stage
22 Bridge IC structure
23 Antenna
24 Electromagnetic interference shield
25 Inductor
26 Capacitor
27 Protective layer

DESCRIPTION OF THE EMBODIMENTS

The implementation mode of the present disclosure will be described below through exemplary embodiments. Those skilled in the art can easily understand other advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure. When describing the embodiments of the present disclosure in detail, for the convenience of description, the cross-sectional views showing the device structure will not be partially enlarged according to the general scale, and the schematic diagrams are only embodiments, which should not limit the protection scope of the present disclosure. In addition, the three-dimensional spatial dimensions of length, width and depth should be included in the actual production.

For convenience of description, spatially relative terms such as "under," "below," "lower," "down," "above," "on," etc. may be used herein to describe the relationship of an element or a feature to other components or features shown in the drawings. It will be understood that these spatially relative terms are intended to encompass other directions of the device in use or operation than those depicted in the drawings. In addition, when a layer is referred to as being 'between' two layers, it can be the only layer between the two layers, or one or more intervening layers between the two layers.

In some embodiments of the present disclosure, when a first feature is "on" a second feature, the first feature and the second feature may be formed in direct contact, or additional features may be formed between the first feature and the second feature, in this way, the first feature and the second feature may not be in direct contact.

It needs to be stated that the drawings provided in the following embodiments are just used for schematically describing the basic concept of the present disclosure, thus only illustrating components only related to the present disclosure and are not drawn according to the numbers, shapes and sizes of components during actual implementation, the configuration, number and scale of each component during actual implementation thereof may be freely changed, and the component layout configuration thereof may be more complicated. In order to make the illustrations as concise as possible, not all structures are shown in the attached drawings.

The present disclosure provides a method for preparing a wafer-level ASIC 3D integrated substrate.

Figure 1:
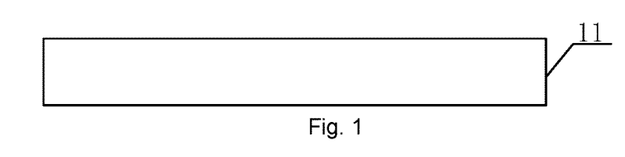
FIGS. 1-11 show schematic cross-sectional views of structures after each step of the manufacturing process of a wafer-level ASIC 3D integrated substrate according to the present disclosure.
Figure 2:
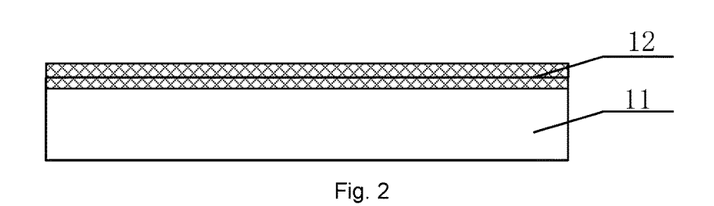

Refer to FIG. 1, a carrier 11 is provided, and a separation layer 12 is formed on the carrier 11, the obtained structure is shown in FIG. 2.

Figure 3:
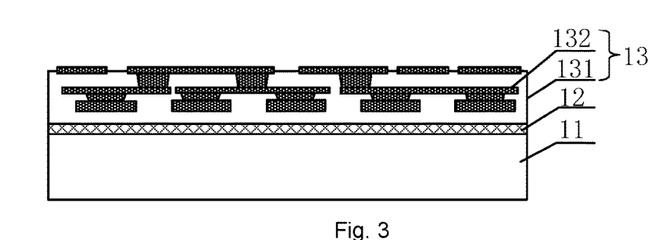

A first wiring layer 13 is formed on the separation layer 12. The first wiring layer 13 may also be called a frontal wiring layer, since the first wiring layer 13 will be used for frontal mounting with the chip in subsequent device packaging. The first wiring layer 13 includes a first dielectric layer 131 and a first metal wire layer 132. The top surface of the first metal wire layer 132 is exposed from the top surface of the first dielectric layer 131, and the obtained structure is shown in FIG. 3.

Conductive pillars 14 are formed on the first wiring layer 13. The conductive pillars 14 include, but not limited to, copper pillars. The conductive pillars 14 are electrically connected to the first metal wire layer 132. In an embodiment, a method for forming the conductive pillars 14 may include: forming a metal seed layer using a process including, but not limited to, a vapor deposition process; forming an electroplated copper layer on a surface of the metal seed layer using a process including, but not limited to, an electroplating process; and photolithographic etching the formed electroplated copper layer and the metal seed layer to form a plurality of conductive pillars 14 spaced at an interval from each other.

Figure 4:
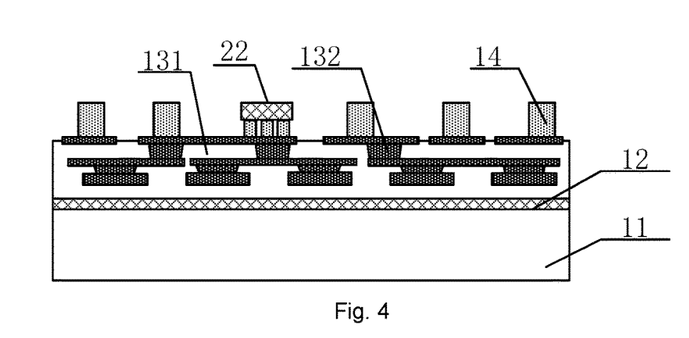

A bridge IC 22 may be electrically connected to one of the conductive pillars 14 as in FIG. 4. For example, the bridge IC 22 is disposed on a surface of one of the conductive pillars 14 which is shortened such that the bridge IC 22 can fit on top of the shortened pillar so the bridge IC 22 is flush or nearly flush with top surfaces of other not-shortened conductive pillars 14 which are not connected to the bridge IC 22. In other examples, the bridge IC 22 may have connecting legs which may be disposed on the surface of the first wiring layer, then the plurality of conductive pillars 14 are formed, this is not strictly limited. However, first forming the conductive pillars and then accessing to the bridge IC can avoid damage to the bridge IC during the process of forming the conductive pillars. The bridge IC with legs is accessed, so that the substrate can access more different types of chips in the subsequent packaging process, to further improve packaging integration.

Figure 5:
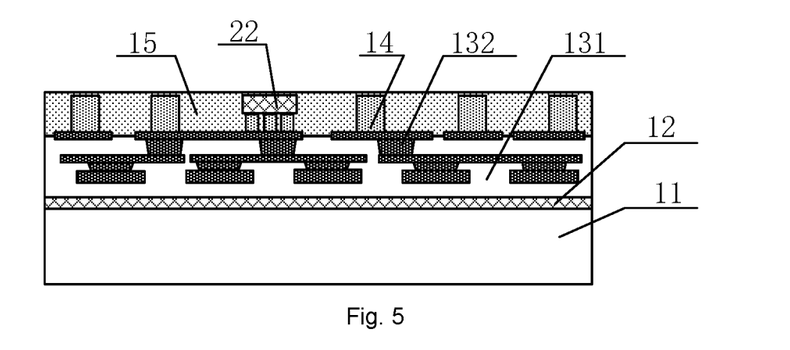
Figure 6:
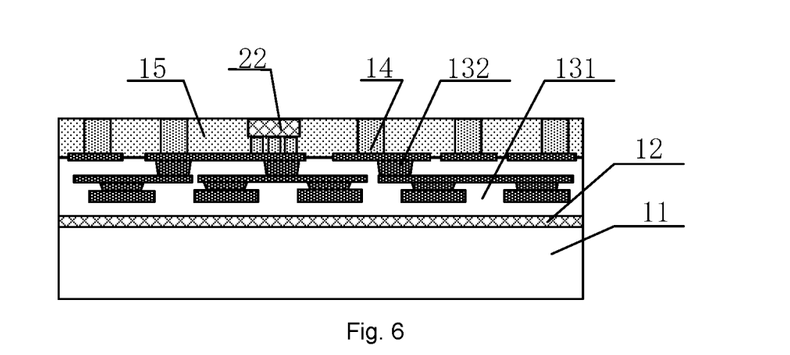

After connecting the bridge IC 22 to one of the conductive pillars 14, a molding layer 15 is formed, the molding layer 15 molds the conductive pillars 14 and the bridge IC 22, and the plurality of conductive pillars 14 and the bridge IC 22 are exposed on a surface of the molding layer 15. Specifically, the molding layer 15 molding the conductive pillars 14 and the bridge IC 22, with conductive legs or mounted on one of the conductive pillars, may be formed by a method including but not limited to one or more of compression molding, transfer molding, liquid packaging molding, vacuum lamination and spin coating, and the obtained structure is shown in FIG. 5. The obtained structure is planarized by a method including but not limited to grinding, so that top surfaces of the conductive pillars 14 are flush with a top surface of the molding layer 15, to obtain the structure shown in FIG. 6. The material of the molding layer 15 includes, but not limited to, one or more of polyimide, silicone, and epoxy resin. In other examples, the molding layer 15 may be formed, then openings are formed in the molding layer 15, and the openings are filled with metal material to form the conductive pillars 14. However, forming the conductive pillars 14 first and then molding ensures electrical connection between the conductive pillars 14 and the first wiring layer 13 and reduces alignment difficulties.

Figure 7:
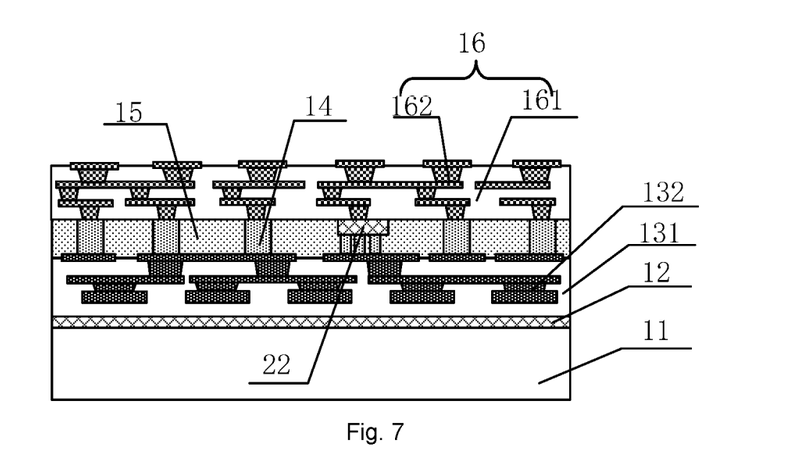

A second wiring layer 16 (also called back wiring layer or reverse wiring layer) is formed on the molding layer 15. The second wiring layer 16 includes a second dielectric layer 161 and a second metal wire layer 162. The top surface of the second metal wire layer 162 is exposed from the top surface of the second dielectric layer 161, and the second metal wire layer 162 is electrically connected to the conductive pillars 14 and can be electrically connected to the bridge IC 22 at the same time, the obtained structure is shown in FIG. 7. In other examples, more conductive pillars and more wiring layers may continue to be formed over the second wiring layer as needed to form a stack of three or more wiring layers.

Figure 8:
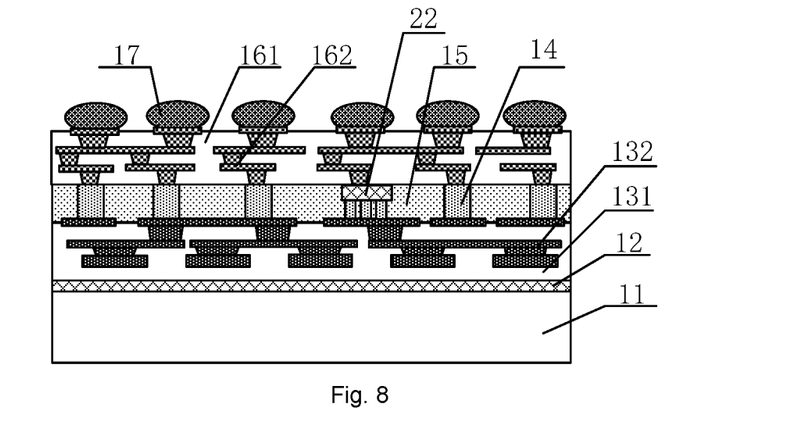

Solder balls 17 are formed on the second wiring layer 16, the solder balls 17 are electrically connected to the second metal wire layer 162, the obtained structure is shown in FIG. 8. For example, openings may be formed in the second wiring layer 16 to expose the top surface of the second metal wire layer 162, and then solder balls 17 may be formed inside the corresponding openings using a ball mount method, which helps to ensure good electrical contact between the solder balls 17 and the second metal wire layer 162. The material of the solder balls 17 includes, but is not limited to, tin, gold, copper or an alloy of tin and copper.

Figure 9:
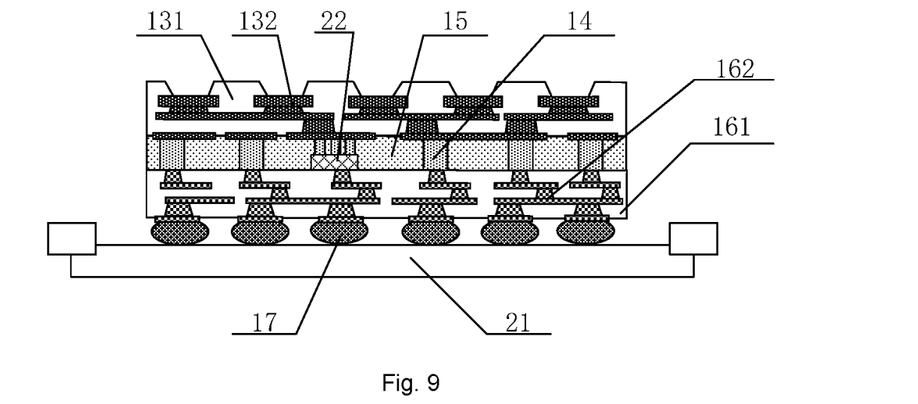
Figure 10:
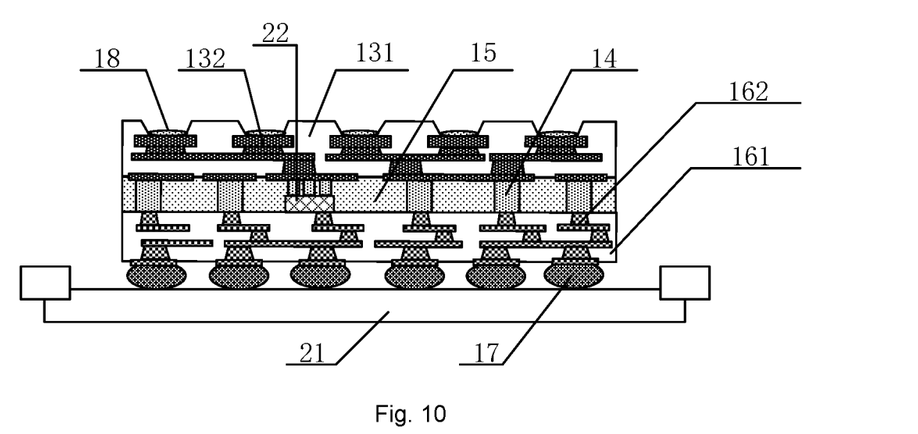
Figure 11:
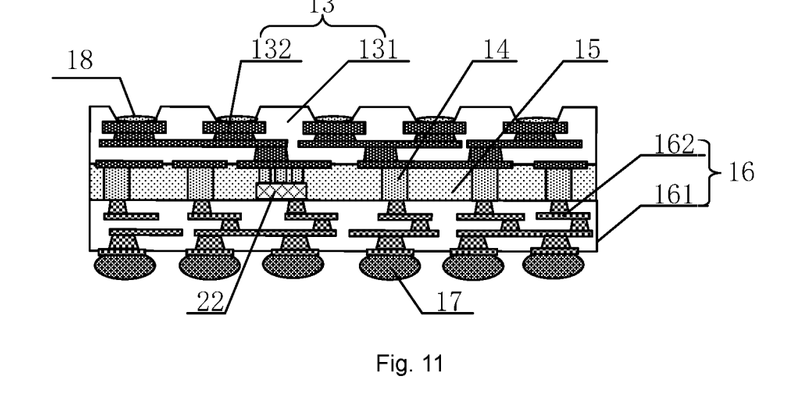

After forming the solder balls 17, the carrier 11 is peeled off by the separation layer 12 to expose the underneath surface of the first wiring layer 13 away from the conductive pillars 14, and the first metal wire layer 132 is exposed from the outer surface of the first wiring layer 13. For example, the structure obtained in the preceding steps may be placed upside down (i.e., solder balls 17 facing down) on a carrier 21, and the carrier 11 may be peeled off depending on the material of the separation layer 12. For example, when the separation layer 12 is a UV resin layer, the separation layer 12 may be irradiated using UV light, thereby peeling off the carrier 11. The obtained structure after this step is shown in FIG. 9. To avoid oxidation of the exposed metal wire layer in air, in one example, an OSP antioxidant layer 18 may be formed on the surface of the first wiring layer 13 away from the conductive pillars 14 before peeling off the carrier 11. The OSP antioxidant layer 18 covers the surface of the first metal wire layer 132, and the obtained structure obtained is shown in FIG. 10. After peeling off the carrier 11, the obtained structure is shown in FIG. 11. The OSP antioxidant layer is an organic solder preservation film, also known as a copper protector. The OSP antioxidant layer is prepared by a process, in which an organic skin layer is chemically grown on a clean surface of the first metal wire layer 132 (e.g., a copper layer). The OSP antioxidant layer 18 is resistant to oxidation, thermal shock and humidity, which prevents the top surface of the first metal wire layer 132 from being exposed to air and becoming rusted (oxidation or sulfidation, etc.). Then at the subsequent high soldering temperature, the OSP antioxidant layer 18 can be easily and quickly removed by a flux material, thus the surface of the exposed first metal wire layer 132 may be bonded to the molten solder balls 17 for a very short period of time to form solid solder joints.

The wafer-level ASIC 3D integrated substrate of the present disclosure is manufactured by a semiconductor front-end manufacturing process, so both the minimum line width and line spacing of the substrate can be ~1.5 µm, and the overall thickness of the substrate can be less than ~0.2 mm, which can achieve high-density and high-integration packaging when used for device packaging, thus is conducive to the further reduction of device packaging size. The preparation process of the substrate is simple and can be customized on a large scale, which helps to shorten the process time and reduce the packaging cost, and the preparation process of the substrate does not require inventing new chips, which reduces the risk of chip damage and helps to improve the packaging yield.

As an embodiment of the disclosure, a process for forming the first wiring layer 13 includes: forming a first dielectric layer 131 on the separation layer 12 using a process including but not limited to a vapor deposition process; forming an opening in the first dielectric layer 131 aligning to the first metal wire layer 132 using a photolithography and etching process; forming a first metal material layer within the opening and at a surface of the first dielectric layer 131 to form the first metal wire layer 132 using a method including but not limited to one or more of sputtering, electroplating, chemical plating, etc. The material of the first dielectric layer 131 includes, but is not limited to, one or more of epoxy resin, silicone, PI, PBO, BCB, silicon oxide, phosphor silica glass, fluorine containing glass, and may also be other high K dielectric materials. The material of the first metal wire layer 132 includes, but is not limited to, one or more of gold, silver, copper, aluminum, and other metals, and is preferably copper layer. Both the first dielectric layer 131 and the first metal wire layer 132 may have single or multi-layer structures. When the first metal wire layer 131 has multi-layer structures, the first metal wire layers 132 of the different layers are electrically interconnected to each other. The material and preparation process of the second wiring layer 16 can be the same as the material and preparation process of the first wiring layer 13, which will not be described in detail.

As an example, the thickness of the first wiring layer 13 and the thickness of the second wiring layer 16 range from 15 µm to 40 µm, and the thickness of the first wiring layer 13 and the thickness of the second wiring layer 16 can be the same or different, depending on the need. The specific structure of the first wiring layer 13 and the second wiring layer 16 can be flexibly adjusted according to the number/type of chips to be packaged, making the integrated substrate of the present disclosure suitable for use in a variety of packaging structures.

In an embodiment, the thickness of the molding layer 15 ranges from 50 µm to 100 µm. By forming the conductive pillars 14 and the molding layer 15 molding the conductive pillars 14, the height of the entire substrate can be increased, which helps to further reduce the stress on the substrate and facilitates subsequent device packaging.

The carrier 11 mainly plays a supporting role to avoid undesirable bending and deformation during device preparation. As an example, the carrier 11 includes but is not limited to glass, silicon substrate, sapphire substrate, ceramic substrate, metal substrate and other substrates with a certain degree of hardness and not prone to bending deformation. A transparent substrate such as a glass substrate is preferred in this example, which helps peeling the carrier 11 from the separation layer 12. For example, the back side of the carrier 11 is irradiated with UV light to peel the carrier 11 from the separation layer 12. Before preparing the separation layer 12, the carrier 11 may be cleaned and dried.

The release layer 12 may have a single-layer or multi-layer structure, and may include a release layer and a protective layer disposed on a surface of the release layer. Specifically, the release layer includes, but is not limited to, one or more of a carbon material layer, a resin material layer, and an organic material layer, and the protective layer includes, but is not limited to, a polyimide layer. For example, if the carrier 11 is a transparent substrate such as glass and the release layer 12 is a UV resin layer, the release layer 12 may be irradiated from the back side of the carrier 11 to peel the carrier 11 from the release layer 12. The separation layer 12 may also be a Light to Heat Conversion (LTHC) layer, and the LTHC layer may be heated using laser and other methods in the subsequent steps to separate the carrier 11 from the LTHC layer, thereby reducing the process difficulty of peeling and preventing device damage. A method for forming the separation layer 12 may depend on the material of the separation layer 12, and the method may include one or more of spin coating, spraying, direct attachment, etc.

The preparation method of the present disclosure may prepare a single wafer-level ASIC 3D integrated substrate or multiple substrates, and when multiple wafer-level ASIC 3D integrated substrates are prepared, the preparation method further includes: after forming the OSP antioxidant layer 18, separating the wafer-level ASIC 3D integrated substrates from each other by dicing. The dicing may also be performed after attaching the chip onto a surface of the substrate.

The present disclosure further provides a wafer-level ASIC 3D integrated substrate, which can be prepared based on any of the aforementioned preparation methods, so the foregoing may be incorporated herein by reference in its entirety. Specifically, as shown in FIG. 11, the wafer-level ASIC 3D integrated substrate includes a first wiring layer 13, conductive pillars 14, a bridge IC 22, a molding layer 15, a second wiring layer 16, and solder balls 17. The first wiring layer 13 includes a first dielectric layer 131 and a first metal wire layer 132, the first metal wire layer 132 is exposed on a surface of the first dielectric layer 131. The second wiring layer 16 includes a second dielectric layer 161 and a second metal wire layer 162, the second metal wire layer 162 is exposed on a surface of the second dielectric layer 161. The conductive pillars 14 are disposed between the first wiring layer 13 and the second wiring layer 16, and two ends of the conductive pillars 14 are electrically connected to the first metal wire layer 132 and the second metal wire layer 162 respectively. One end of the bridge IC 22, through its conductive legs, is electrically connected to at least one of the plurality of connective pillars 14, and the other end of the bridge IC 22 is flush with top surfaces of the other conductive pillars 14 not connected to the bridge IC 22 and may be electrically connected to the second wiring layer 16. The molding layer 15 molds the conductive pillars 14 and the bridge IC 22. The solder balls 17 are disposed on a side of the second wiring layer 16 away from the conductive pillars 14 and is electrically connected to the second metal wire layer 162.

In an example, the wafer-level ASIC 3D integrated substrate further includes an OSP antioxidant layer 18. The OSP antioxidant layer 18 is disposed on a surface of the first wiring layer 13 away from the conductive pillars 14 and covers a surface of the first metal wire layer 132.

For more description of the wafer-level ASIC 3D integrated substrate, please refer to the preceding, which will not be repeated for the purpose of brevity. The wafer-level ASIC 3D integrated substrate of the present disclosure can be used in both 2.5D packages and 3D packages, and its entirety acts as a silicon interposer that can simultaneously integrate various electronic chips and components such as millimeter wave antennas, capacitors, inductors, electric crystal switches, GPUs, PMUs, DDRs, flash memories, filters, etc., and can be compatible with conventional substrates, such as with FBGA substrates. That is, based on the wafer-level ASIC 3D integrated substrate of the present disclosure, various packaging technologies such as System in a Package (SIP), Flip Chip Scale Package (FCCSP), Antenna-in-Package (AIP), Fan-out (FO) Package, etc. can be implemented.

The present disclosure further provides a packaging device, the packaging device includes a packaging chip and a wafer-level ASIC 3D integrated substrate as described in any of the above examples. The packaging chip is disposed on a surface of the wafer-level ASIC 3D integrated substrate and electrically connected to the wafer-level ASIC 3D integrated substrate. For more description of the wafer-level ASIC 3D integrated substrate, please refer to the preceding, which will not be repeated for the purpose of brevity. After preparing the wafer-level ASIC 3D integrated substrate, the packaging chip can be soldered to the front or back of the substrate through a bump 20 or pad on the packaging chip depending on the type of packaging chip according to the method for preparing the packaging device. In addition, passive devices such as inductors and capacitors can be attached on the surface of the substrate, and the various types of packaged devices based on the 3D integrated substrate will be explained in detail below.

Figure 12:
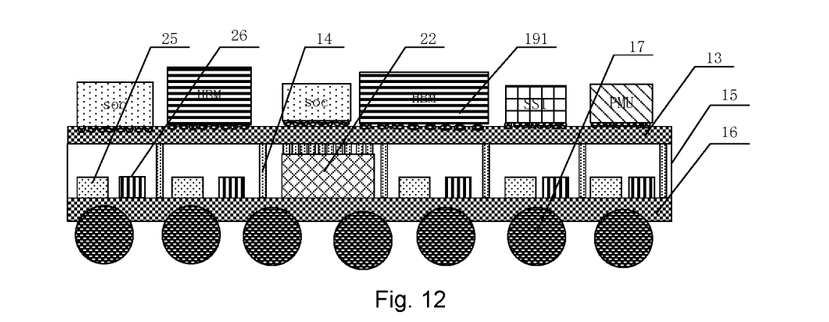
FIGS. 12-16 show cross-sectional views of packaging device structures according to different embodiments of the present disclosure.

In an example, the packaging device further includes an inductor 25 and a capacitor 26 disposed on the surface of the wafer-level ASIC 3D integrated substrate and electrically connected to the second wiring layer 16. In other examples, the inductor 25 and the capacitor 26 may be electrically connected to the first wiring layer. The packaging chip further includes an active device 191 disposed on the surface of the first wiring layer 13 away from the molding layer 15 and electrically connected to the first wiring layer 13. Specifically, as shown in FIG. 12 (the specific structures of the first wiring layer 13 and the second wiring layer 16 are not illustrated in FIGS. 12-16 for brevity of the illustration), the active device 191 includes one or more of an SOC device, an HBM device, an SSI device and a PMU device, and a single active device or a plurality of active devices is provided. In an example, 2 HBM devices and 2 SOC devices are provided, and one HBM device and one PMU device are provided, these active devices are arranged at an interval from each other on the front side of the substrate (i.e., the surface away from the solder balls), the inductor and the capacitor are set correspondingly with each active device, for example, each active device corresponds to an inductor-capacitor pair.

Figure 13:
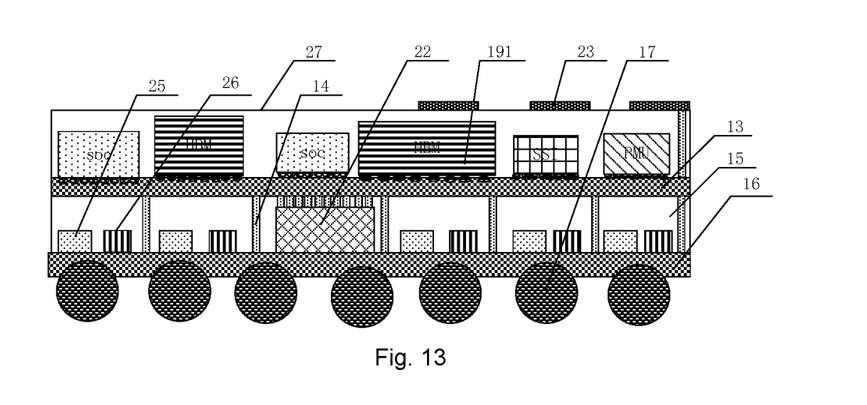

In an embodiment, as shown in FIG. 13, the packaging device includes the active device 191, the inductor 25, and the capacitor 26. The active device 191 includes one or more of an SOC device, an HBM device, an SSI device and a PMU device, and a single active device or a plurality of active devices is provided. The active device 191, the inductor 25, and the capacitor 26 are arranged in the same manner as that in FIG. 12. The packaging device further includes a protective layer 27 and an antenna 23, the protective layer 27 covers the active device 191, the antenna 23 is disposed on a surface of the protective layer 27 and is electrically connected to the conductive pillars 14. For example, after the attachment of the packaging chip, an electrical lead structure electrically connected to the first wiring layer is formed, and the electrical lead structure is exposed on the surface of the protective layer 27 and is electrically connected to the antenna formed afterwards. In an example, the protective layer 27 may be a molding material which, after attaching (e.g., attaching to the surface of the first wiring layer through a conductive silver adhesive) or soldering the active device to the surface of the first wiring layer, the protective layer covering the active device is formed by spin coating or other processes. In other examples, the protective layer 27 may also be a prefabricated plastic housing over the periphery of the active device 191, and the antenna 23 may be prefabricated and then disposed to the surface of the protective layer 27, or the antenna 23 may be formed by a sputtering process after forming the protective layer 27.

Figure 14:
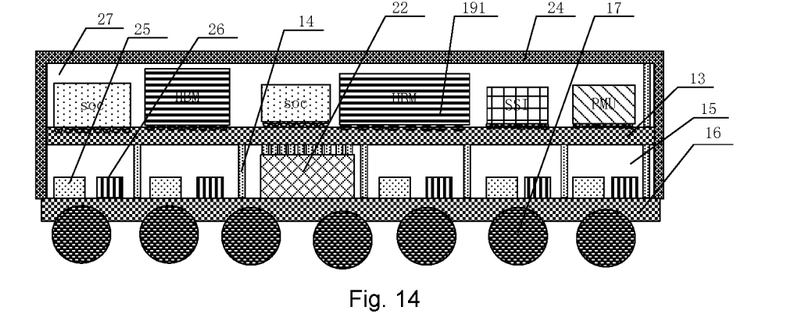

In an example, as shown in FIG. 14, the packaging device includes the active device 191, the inductor 25, and the capacitor 26. The active device 191 includes one or more of an SOC device, an HBM device, an SSI device and a PMU device, and a single active device or a plurality of active devices is provided. The active device 191, the inductor 25, and the capacitor 26 are arranged in the same manner as that in FIG. 12. The packaging device further includes a protective layer 27 and an EMI shield 24, the protective layer 27 covers the active device 191, and the EMI shield 24 extends from the surface of the protective layer 27 to a side of the first wiring layer 13 and the molding layer 15. The protective layer 27 may be a molding material layer or a prefabricated plastic housing, and the EMI shield 24 may be a prefabricated metal layer or be prepared by a sputtering process on the protective layer 27.

Figure 15:
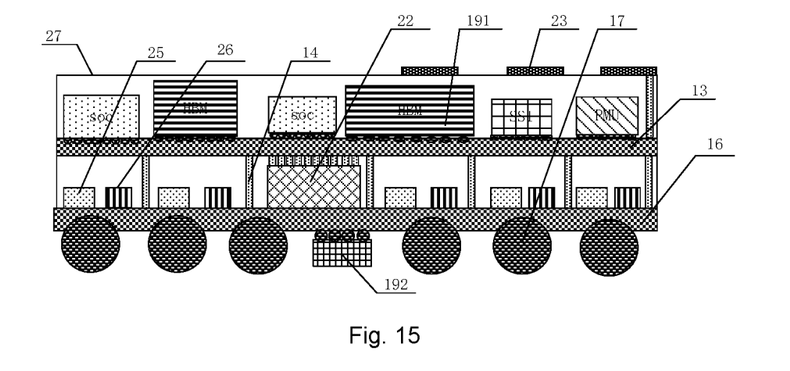

In an example, as shown in FIG. 15, the packaging device includes an active device 191, a passive device 192, an inductor 25 and a capacitor 26. The active device 191 is disposed on the surface of the first wiring layer 13 away from the molding layer 15 and electrically connected to the first wiring layer 13. The Integrated Passive Device (IPD) is disposed on a surface of the second wiring layer 16 away from the molding layer 15 and is electrically connected to the second wiring layer 16. The inductor 25 and capacitor 26 are disposed on the surface of the wafer-level ASIC 3D integrated substrate and are electrically connected to the second wiring layer 16. In other examples, the inductor 25 and capacitor 26 may be electrically connected to the first wiring layer. The active device 191 includes one or more of an SOC device, an HBM device, an SSI device and a PMU device, and a single active device or a plurality of active devices is provided. In further examples, the packaging device further includes a protective layer 27 and an antenna 23, the protective layer 27 covers the active device 191, and the antenna 23 is disposed on the surface of the protective layer 27 and electrically connected to the conductive pillars 14. The protective layer 27 may be a molding material layer or prefabricated housing, the antenna 23 may be prefabricated or formed by a sputtering process, please refer to the previous content, which will not be repeated for the purpose of brevity. That is, the packaging device of this example is based on FIG. 13 with the addition of the passive device 192.

Figure 16:
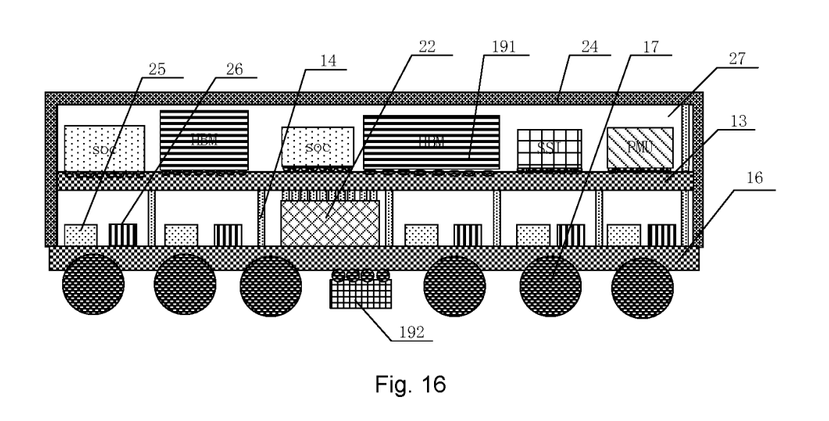

In an example, as shown in FIG. 16, the packaging device includes an active device 191, a passive device 192, an inductor 25, a capacitor 26, a protective layer 27, and an EMI shield 24. The active device 191 includes one or more of an SOC device, an HBM device, an SSI device and a PMU device, and a single active device or a plurality of active devices is provided. The protective layer 27 covers the active device 191, and the passive device 192 is disposed on the surface of the second wiring layer 16 away from the molding layer 15 and electrically connected to the second wiring layer 16. The EMI shield 24 extends from the surface of the protective layer 27 to a side of the first wiring layer 13 and the molding layer 15. The protective layer 27 may be a molding material layer or a prefabricated plastic housing, and the EMI shield 24 may be a prefabricated metal layer or prepared by a sputtering process on the protective layer 27. That is, the packaging structure of this example is based on FIG. 14 with the addition of the passive device 192 disposed on the back side of the substrate (i.e., the surface where the solder balls are disposed).

Figure 17:
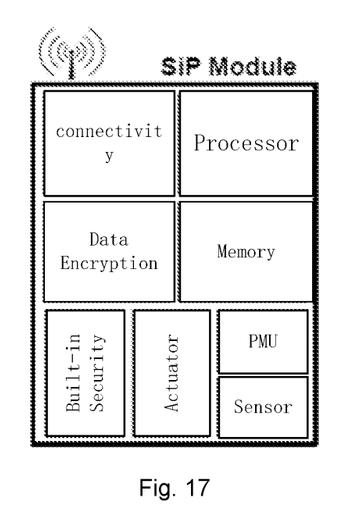
FIG. 17 shows a schematic top view of a packaging device according to the present disclosure.

As shown in FIG. 17, the packaging device may be a system-level Antenna-in-Package (AIP) module that can integrate a processor, a sensor, a data encryption chip, an actuator, a memory, a connector, a built-in security chip, and other devices. The devices can be arranged on the surface of the substrate, and an antenna and/or EMI shield may be formed on the surface of the packaging device.

Due to the aforementioned wafer-level ASIC 3D integrated substrate, the integration of the packaging device of the present disclosure is improved while the size of the packaging device is reduced, the cost is reduced, and the parasitic capacitance of the substrate is eliminated to reduce noise from the packaging device. At the same time, the power efficiency is improved, and the response efficiency and reliability of the device is improved. The packaging device of the present disclosure has low requirements on design margin, which can further improve its applicability.

In summary, the present disclosure provides a wafer-level ASIC 3D integrated substrate, a packaging device and a preparation method. With the wafer-level ASIC 3D integrated substrate of the present disclosure, the minimum line width and line spacing of the wafer-level ASIC 3D integrated substrate of the present disclosure can be reduced to about 1.5 μm, which is much smaller than 20 μm of those widths on the conventional substrate, thus enabling high-density and high-integration packaging of the device. The thickness of the substrate can be less than ~0.2 mm (the thickness of the traditional FBGA 10-layer board is 1 mm), which helps to further reduce the size of the packaging device. The time for fabricating the substrate is relatively short, which can realize scale customization and help to reduce the package cost. The substrate does not need to be packaged with chips, which can reduce the risk of chip damage and help to improve the packaging yield, and the bridge IC is connected to the inside of the substrate, which can further improve the integration of the packaging device. By using the wafer-level ASIC 3D integrated substrate of the present disclosure for packaging, various electronic chips and components such as millimeter wave antenna, capacitor, inductor, electric crystal switch, GPU, PMU, DDR, flash memory and filter can be integrated to realize system-level packaging. The packaging device packaged based on the wafer-level ASIC 3D integrated substrate of the present disclosure can not only reduce the cost, but also eliminate the parasitic capacitance of the substrate and reduce the device noise; meanwhile, it can improve the power efficiency and increase the device response efficiency and reliability; the requirement for the design margin of the device is low, which makes the packaging device of the present disclosure more widely applicable. Therefore, the disclosure effectively overcomes the shortcomings of the prior art and has a high industrial use value.

While particular elements, embodiments, and applications of the present disclosure have been shown and described, it is understood that the disclosure is not limited thereto because modifications may be made by those skilled in the art, particularly in light of the foregoing teaching. It is therefore contemplated by the appended claims to cover such modifications and incorporate those features which come within the spirit and scope of the disclosure.

What is claimed is:

1. A method for preparing a wafer-level ASIC 3D integrated substrate, comprising:
providing a carrier;
forming a separation layer on the carrier;
forming a first wiring layer on the separation layer, wherein the first wiring layer comprises a first dielectric layer and a first metal wire layer, wherein a top surface of the first metal wire layer is exposed from a top surface of the first dielectric layer,
forming a plurality of conductive pillars on the first wiring layer, wherein the plurality of conductive pillars is electrically connected to the first metal wire layer;
disposing and connecting electrically a bridge IC structure on a surface of one of the plurality of conductive pillars, which is shortened such that the bridge IC structure fits the shortened conductive pillar so the bridge IC structure is flush with top surfaces of other not-shortened conductive pillars;
forming a molding layer, wherein the molding layer molds the plurality of conductive pillars and the bridge IC structure, and the plurality of conductive pillars is exposed on a surface of the molding layer;
forming a second wiring layer on the molding layer, wherein the second wiring layer comprises a second dielectric layer and a second metal wire layer, wherein the second metal wire layer is exposed on a surface of the second dielectric layer, and the second metal wire layer is electrically connected to the plurality of conductive pillars;
forming solder balls on the second wiring layer, wherein the solder balls are electrically connected to the second metal wire layer, and
peeling the carrier from the separation layer to expose a surface of the first wiring layer away from the plurality of conductive pillars, wherein the first metal wire layer is exposed on the surface of the first wiring layer.

2. The method according to claim 1, wherein a thickness of the first wiring layer and a thickness of the second wiring layer ranges from 15 μm to 40 μm, and a thickness of the molding layer ranges from 50 μm to 100 μm.

3. The method according to claim 1, further comprising: forming an Organic Solderability Preservatives (OSP) antioxidant layer on the surface of the first wiring layer away from the conductive pillar before peeling off the carrier, wherein the OSP antioxidant layer covers a surface of the first metal wire layer.

4. The method according to claim 3, wherein when a plurality of wafer-level ASIC 3D integrated substrates is provided, the method further comprises: separating the wafer-level ASIC 3D integrated substrates from each other by dicing after forming the OSP antioxidant layer.

* * * * *